(12) United States Patent
Wang et al.

(10) Patent No.: US 9,396,990 B2
(45) Date of Patent: Jul. 19, 2016

(54) CAPPING LAYER FOR IMPROVED DEPOSITION SELECTIVITY

(71) Applicant: Taiwan Semiconductor Manufacturing Co., Ltd., Hsin-Chu (TW)

(72) Inventors: Chao-Chun Wang, Hsinchu (TW); Su-Jen Sung, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/755,089

(22) Filed: Jan. 31, 2013

(65) Prior Publication Data
US 2014/0210085 A1  Jul. 31, 2014

(51) Int. Cl.
*H01L 29/40* (2006.01)
*H01L 21/768* (2006.01)
*H01L 23/532* (2006.01)

(52) U.S. Cl.
CPC .... *H01L 21/76832* (2013.01); *H01L 21/76829* (2013.01); *H01L 21/76835* (2013.01); *H01L 21/76849* (2013.01); *H01L 23/5329* (2013.01); *H01L 23/53238* (2013.01); *H01L 23/53295* (2013.01); *H01L 2924/0002* (2013.01)

(58) Field of Classification Search
CPC ............... H01L 2924/01029; H01L 21/76843; H01L 2924/01079; H01L 23/53271
USPC .................................................. 257/750–758
See application file for complete search history.

(56) References Cited

U.S. PATENT DOCUMENTS 6,875,687 B1 * 4/2005 Weidman .............. C23C 16/325
                                                                    257/759
6,974,772 B1 * 12/2005 King .................. H01L 21/76802
                                                                    257/E21.576

(Continued)

FOREIGN PATENT DOCUMENTS

KR       20060090449 A     8/2006
KR       20060120990 A     11/2006

OTHER PUBLICATIONS

Yang et al "Characterization of copper electromigration dependence on selective chemical vapor deposited cobalt capping layer thickness" IEEE electronic device letters, vol. 32, No. 4, Apr. 2011.*

(Continued)

*Primary Examiner* — Cuong Q Nguyen
*Assistant Examiner* — Nishath Yasmeen
(74) *Attorney, Agent, or Firm* — Eschweiler & Associates, LLC

(57) ABSTRACT

The present disclosure relates to a method and apparatus for improving back-end-of-the-line (BEOL) reliability. In some embodiments, the method forms an extreme low-k (ELK) dielectric layer having one or more metal layer structures over a semiconductor substrate. A first capping layer is formed over the ELK dielectric layer at a position between the one or more metal layer structures. A second capping layer is then deposited over the one or more metal layer structures at a position that is separated from the ELK dielectric layer by the first capping layer. The first capping layer has a high selectivity that limits interaction between the second capping layer and the ELK dielectric layer, reducing diffusion of the atoms from the second capping layer to the ELK dielectric layer and improving dielectric breakdown of the ELK dielectric layer.

18 Claims, 7 Drawing Sheets

(56) References Cited

U.S. PATENT DOCUMENTS

| | | | |
|---|---|---|---|
| 7,626,245 B2 | 12/2009 | Tsai et al. | |
| 7,629,690 B2 | 12/2009 | Wu et al. | |
| 7,838,440 B2 * | 11/2010 | Park | H01L 21/02126 257/758 |
| 2003/0113995 A1 | 6/2003 | Xia et al. | |
| 2006/0006538 A1 * | 1/2006 | Allman et al. | 257/758 |
| 2008/0318430 A1 | 12/2008 | Park | |

OTHER PUBLICATIONS

Notice of Allowance Dated Aug. 1, 2014 KR Patent Application No. 10-2013-0038405.

\* cited by examiner

US 9,396,990 B2

CAPPING LAYER FOR IMPROVED DEPOSITION SELECTIVITY

BACKGROUND

The fabrication of integrated chips can be broadly separated into two main sections, front-end-of-the-line (FEOL) fabrication and back-end-of-the-line (BEOL) fabrication. FEOL fabrication includes the formation of devices (e.g., transistors, capacitors, resistors, etc.) within a semiconductor substrate. BEOL fabrication includes the formation of one or more metal interconnect layers comprised within one or more insulating dielectric layers disposed over the semiconductor substrate. The metal interconnect layers of the BEOL electrically connect individual devices of the FEOL to external pins of an integrated chip.

DETAILED DESCRIPTION

Figure 1A:
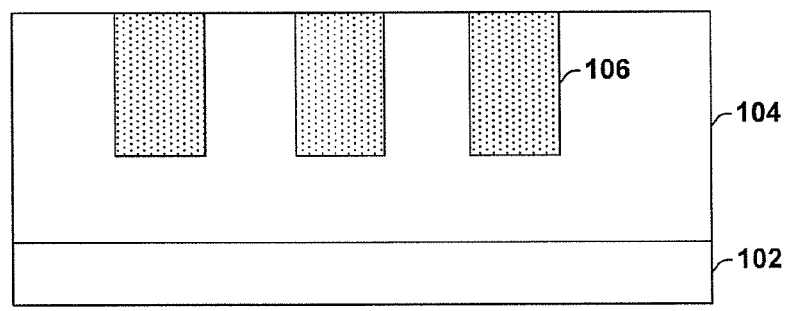
FIGS. 1A-1B illustrate cross-sectional views showing formation of a back-end-of-the-line metal layer using a conventional metal capping process.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Figure 1B:
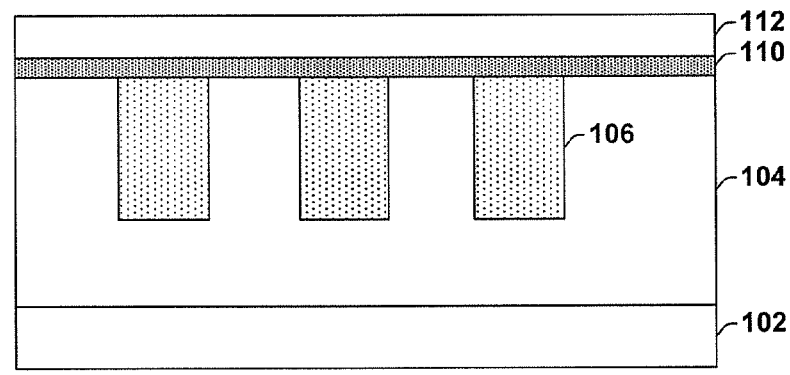

FIGS. 1A-1B illustrates cross-sectional views, 100 and 108, showing formation of a back-end-of-the-line (BEOL) metal layer of an integrated chip (IC) using a conventional metal capping process.

As shown in cross-sectional view 100, a low-k dielectric layer 104 is formed over a semiconductor substrate 102. One or more metal layer structures 106 are formed within the low-k dielectric layer 104. As shown in cross-sectional view 108, after formation of the metal layer structures 106, a capping layer 110 (e.g., a cobalt capping layer) having a substantially uniform thickness is deposited over the low-k dielectric layer 104 and the metal layer structures 106. The capping layer 110 improves electromigration at the top interface of metal layer structures 106. An etch stop layer 112 may be subsequently deposited over the capping layer 110 prior to the formation of an overlying metal layer.

In modern technology nodes (e.g., 45 nm, 32 nm, 22 nm, 14 nm, etc.), low-k dielectric layers, having a low dielectric constant, are used to provide good electrical isolation between adjacent metal layer structures, allowing for spaces between adjacent metal layer structures to shrink and the density of an integrated chip to increase. However, low-k dielectric layers often have a high porosity. The high porosity of low-k dielectric layers leads to diffusion of atoms from the capping layer 110 into the underlying low-k dielectric layer 104. Such diffusion lead to reliability issues, such as poor time dependent dielectric breakdown (TDDB) and voltage breakdown (VBD).

Accordingly, the present disclosure relates to a method and apparatus for improving back-end-of-the-line (BEOL) reliability. In some embodiments, the method comprises forming an extreme low-k (ELK) dielectric layer comprising one or more metal layer structures over a semiconductor substrate. A first capping layer is deposited over the ELK dielectric layer at a position between the one or more metal layer structures, resulting in a planar surface having metal layer structures interspersed between the first capping layer. A second capping layer is then deposited over the one or more metal layer structures. The first capping layer has a high selectivity that limits interaction between the second capping layer and the ELK dielectric layer, reducing diffusion of the atoms from the second capping layer to the ELK dielectric layer and improving dielectric breakdown of the ELK dielectric layer.

Figure 2:
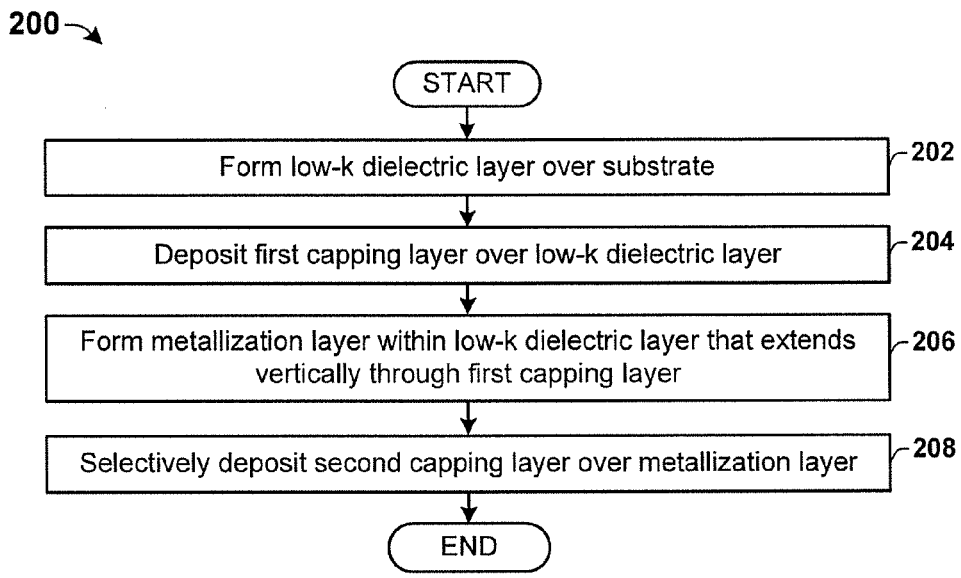
FIG. 2 is a flow diagram of some embodiments of a disclosed method of integrated chip processing that improves back-end-of-the-line reliability.

FIG. 2 is a flow diagram of some embodiments of a method 200 of integrated chip processing that improves back-end-of-the-line (BEOL) reliability by reducing BEOL time dependent dielectric breakdown (TDDB) and voltage breakdown (VBD) caused by diffusion from a first capping layer into a dielectric material.

At act 202, a low-k dielectric layer is formed over a semiconductor substrate. In some embodiments, the low-k dielectric layer comprises an extreme low-k (ELK) dielectric layer with a high porosity having a dielectric constant in a range of between approximately 2.4 and 2.6 and a density in a range of between approximately 1.08 g/cm$^3$ to approximately 1.15 g/cm$^3$.

At act 204, a first capping layer is deposited over the low-k dielectric layer. In some embodiments the high density first capping layer has a density greater than that of the underlying low-k dielectric layer. The first capping layer may be deposited by a blanket deposition of a high density ELK film or a non-porous non-ELK film. In some embodiments, the high density ELK film comprises an ELK film (e.g., SiCO) having a dielectric constant in a range of between approximately 2.6 and 2.8. In other embodiments, the non-ELK film may comprise silicon nitride (SiN), silicon oxide (SiO), silicon carbon nitride (SiCN), or another similar material.

At act 206, a metal layer extending though the first capping layer is formed within the low-k dielectric layer. The resulting structure forms a substantially planar top surface of the substrate having exposed metal layer structures interspersed between the first capping layer.

At act 208, a second capping layer is selectively deposited. Surface properties of the first capping layer cause for the second capping layer to selectively accumulate to a greater thickness over the metal layer structures relative to the first capping layer, thereby providing for a high selectivity of between the first capping layer and the metal layer structures. For example, in some embodiments, the thickness of the second capping layer over the metal layer structures is greater than ten times the thickness of the second capping layer over the first capping layer. In some embodiments, the second capping layer may comprise cobalt.

Therefore, method 200 deposits a first capping layer that minimizes interactions between the second capping layer and the underlying low-k dielectric layer. By minimizing interactions between the second capping layer and the underlying low-k dielectric layer, diffusion from the second capping layer to the underlying porous dielectric material is mitigated, improving TDDB and VDB reliability.

Figure 3:
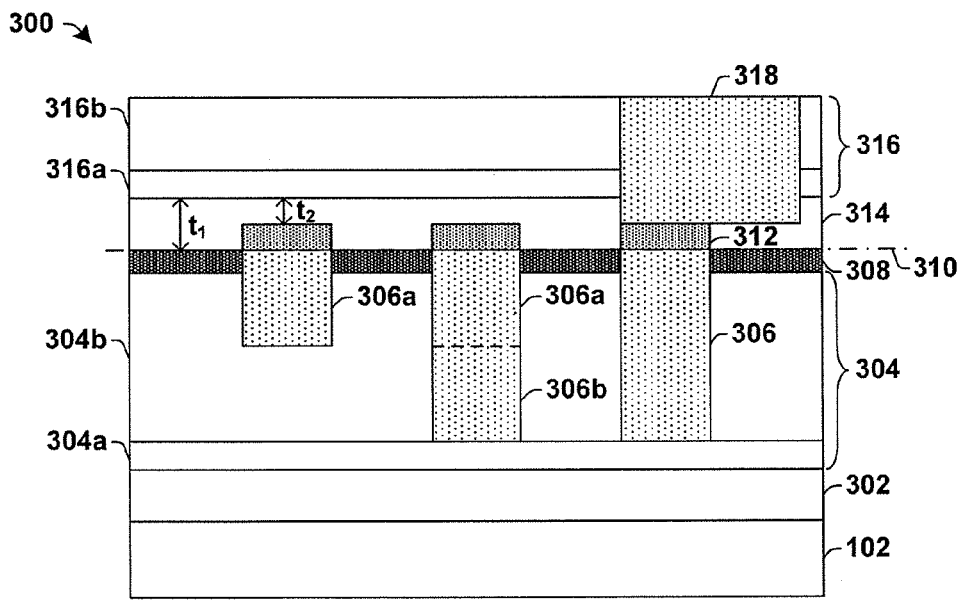
FIG. 3 a cross-sectional view of some embodiments of a back-end-of-the-line (BEOL) layer comprising a first capping layer configured to improve BEOL reliability.

FIG. 3 illustrates a cross-sectional view of some embodiments of a back-end-of-the-line (BEOL) layer 300 comprising a first capping layer configured to improve BEOL reliability.

As shown in BEOL layer 300, a first etch stop layer 302 is disposed over a semiconductor substrate 102. In some embodiments, the semiconductor substrate 102 may comprise one or more semiconductor devices. In various embodiments, the first etch stop layer 302 may comprise silicon nitride (SiN), silicon oxide (SiO), or silicon carbon nitride (SiCN), for example.

A low-k dielectric layer 304 is located over the first etch stop layer 302. In some embodiments, the low-k dielectric layer 304 comprises an extreme low-k (ELK) dielectric layer. The ELK dielectric layer may comprise a lower ELK dielectric layer 304a and upper ELK dielectric layer 304b. The lower ELK dielectric layer 304a comprises an interface layer, located between the upper ELK dielectric layer 304b and the first etch stop layer 302, which has a higher density and dielectric constant than the upper ELK dielectric layer 304b. The lower density of the upper ELK dielectric layer 304b causes the upper ELK dielectric layer 304b to comprise a porous material having a low dielectric constant, k. In some embodiments, the upper ELK dielectric layer 304b comprises a density in a range of between approximately 1.08 g/cm$^3$ and approximately 1.15 g/cm$^3$, which provides for a dielectric constant in a range of between approximately 2.4 and approximately 2.6.

A first metal layer 306 is disposed within the low-k dielectric layer 304. In various embodiments, the first metal layer 306 may comprise a metal interconnect layer 306a and/or a metal via layer 306b (i.e., a metal contact layer). Although FIG. 3 illustrates metal layer 306 as comprising both metal interconnect layers 306a and metal via layers 306b, it will be appreciated that a metal layer may comprise one or more the other, but not necessarily both. In some embodiments, the first metal layer 306 comprises a copper metal layer.

A first capping layer 308 is formed over the low-k dielectric layer 304 at a position between structures of the metal layer 306, resulting in structures of the first metal layer 306 being interspersed between the first capping layer 308 along a planar interface 310. In some embodiments, the first capping layer 308 may comprise a non-ELK film. In some embodiments, the first capping layer 308 may comprise a silicon nitride (SiN) film having a density of greater than 2.4 g/cm$^3$. In other embodiments, the first capping layer 308 may comprise a silicon carbon nitride (SiCN) film having a density in a range of between approximately 1.5 g/cm$^3$ to approximately 2.0 g/cm$^3$. In yet other embodiments, a silicon dioxide (SiO$_2$) film having a density of approximately 1.5 g/cm$^3$.

In other embodiments, the first capping layer 308 may comprise an ELK film having a density that is greater than a density of the underlying low-k dielectric layer 304 (e.g., the upper ELK dielectric layer 304b). For example, in some embodiments, the first capping layer 308 may comprise a silicon oxycarbide (SiCO) film having a density in a range of between approximately 1.3 g/cm$^3$ and approximately 1.4 g/cm$^3$. Such densities provide for a dielectric constant having a value in a range of between approximately 2.8 and approximately 3.0. The higher density of the ELK film provides for a lower porosity than that of the underlying upper ELK dielectric layer 304b.

A second capping layer 312 is disposed over the first metal layer 306. The first capping layer 308 has surface properties that improve selectivity of the second capping layer 312 between the first metal layer 306 and the first capping layer 308, so that the second capping layer 312 forms to a greater thickness over the first metal layer 306 than over the first capping layer 308. Improving the selectivity of the second capping layer 312, reduces diffusion from the second capping layer 312 to the underlying low-k dielectric layer 304, thereby improving TDDB and VDB reliability.

For example, in some embodiments, the second capping layer 312 may comprise a cobalt capping layer configured to improve electromigration at a grain boundary of the first metal layer 306. The first capping layer causes deposition of cobalt to proceed with a high selectivity that causes cobalt to easily accumulate over a metal surface but to not easily accumulate over the first capping layer.

In some embodiments, a second etch stop layer 314 may be disposed over the first capping layer 308 and the second capping layer 312. The second etch stop layer 314 has a first thickness $t_1$ over the first capping layer 308 and a second thickness $t_2$ over the second capping layer 312. The first thickness $t_1$ is greater than the second thickness $t_2$ (i.e., $t_1 > t_2$), since the second capping layer 312 has a greater thickness over the first metal layer 306. Additional metal layers 318 may be formed in additional dielectric layers 316 located over the second etch stop layer 314, in some embodiments.

Figure 4:
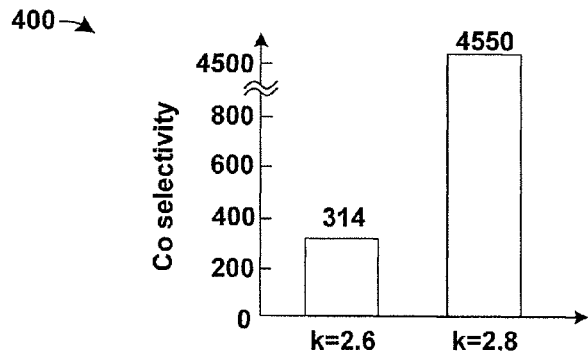
FIG. 4 illustrates graphs showing exemplary cobalt selectivity achieved by a disclosed first capping layer comprising an extreme low-k (ELK) film.

FIG. 4 illustrates a graph 400 showing exemplary cobalt selectivity provided by surface properties of a disclosed first capping layer comprising an ELK film disposed over a blank semiconductor wafer. As provided herein, cobalt selectivity is the ratio of cobalt thickness over a copper metal layer to cobalt thickness over an extreme low-k (ELK) dielectric layer.

As shown in graph 400, the selectivity a first capping layer comprising an ELK film is directly proportional to the dielectric value of the ELK film. For example, an ELK film having a first dielectric value of k=2.6, corresponding to a first density, provides for a copper selectivity of 314. An ELK film having a second dielectric value of k=2.8, corresponding to a second density greater than the first density, provides for a copper selectivity of 4550.

It has been appreciated that the density of an ELK film has an inverse proportionality to the porosity of the ELK film and a direct proportionality to the dielectric value of the ELK film. Therefore, the selectivity a first capping layer comprising an ELK film is directly proportional to the density of the first capping layer, such that by using a first capping layer with a higher density (i.e., a higher dielectric constant) the selectivity of the first capping layer can be increased.

Figure 5:
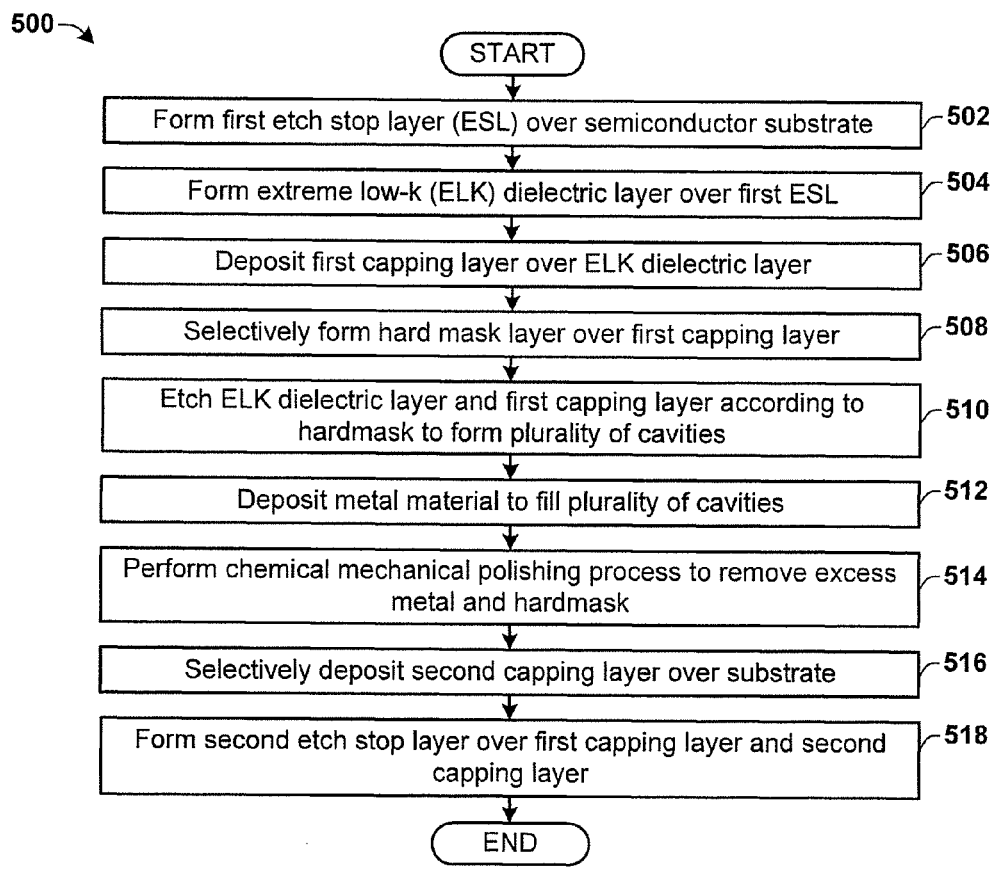
FIG. 5 is a flow diagram of some embodiments of a method of integrated chip processing that improves back-end-of-the-line (BEOL) reliability.

FIG. 5 is a flow diagram of some embodiments of a method 500 of integrated chip processing that improves back-end-of-the-line (BEOL) reliability.

While the disclosed methods (e.g., methods 200 and 500) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 502, a first etch stop layer is formed over a semiconductor substrate.

At act 504, an extreme low-k (ELK) dielectric layer is formed over the first etch stop layer. In some embodiments, the ELK dielectric layer is formed by first forming a lower ELK dielectric layer having a first density, and subsequently forming an upper ELK dielectric layer over the lower ELK dielectric layer. The upper ELK dielectric layer has a second density that is less than the first density.

At act 506, a first capping layer is deposited over the ELK dielectric layer. The first capping layer 308 comprises surface properties that limit accumulation of a second capping layer (act 516) over the first capping layer. In some embodiments, the first capping layer may comprise an ELK dielectric film (e.g., SiCO) having a higher density (i.e., higher dielectric constant) than the underlying ELK dielectric layer. In other embodiments, the first capping layer may comprise a non-ELK dielectric material, such as silicon nitride (SiN), silicon carbide nitride (SiCN), or silicon dioxide ($SiO_2$).

In some embodiments, the first capping layer may be deposited by way of an "ex-situ process", in which the first capping layer (e.g., SiN, SlCN, or $SiO_2$) is deposited over a porous ELK film, after deposition of the ELK dielectric layer, by use of a different tool. In such embodiments, the substrate is exposed to an ambient environment between deposition of the ELK dielectric layer and the first capping layer. In other embodiments, the first capping layer may be deposited by way of an "in-situ process", in which the first capping layer (e.g., the dense ELK film) is deposited over an underlying ELK dielectric layer by a same tool. In such embodiments, the first capping layer is formed without breaking the vacuum used to deposit the underlying ELK dielectric layer.

At act 508, a hardmask is selectively formed over the first capping layer. The hardmask is selectively formed to have a plurality of openings that expose the first capping layer at locations corresponding to one or more metal layer structures.

At act 510, the ELK dielectric layer and the first capping layer are selectively etched according to the hardmask to form a plurality of cavities within the substrate. The plurality of cavities extend though the first capping layer into the ELK dielectric layer, so that the plurality of cavities are disposed between openings in the first capping layer.

At act 512, a metal material is deposited over the substrate to fill the plurality of cavities.

At act 514, a chemical mechanical polishing (CMP) process is performed to remove excess metal material and the hardmask. The CMP process results in a planar surface comprising a plurality of metal layer structures disposed between the first capping layer.

At act 516, a second capping layer is selectively deposited over the substrate. In some embodiments, the second capping layer comprises a cobalt layer. The high selectivity of the first capping layer causes the second capping layer to form to a greater thickness over the metal layer structures than over the first capping layer. For example, in some embodiments, the second capping layer may be formed over the metal layer structures to a thickness that is greater than ten times the thickness of the second capping layer over the first capping layer.

At act 518, a second etch stop layer is optionally deposited over the first capping layer and the second capping layer, in some embodiments. The second etch stop layer has a substantially flat top surface and a first thickness over the first capping layer and a second thickness over the second capping layer.

It will be appreciated that method 500 may be iteratively performed to form a plurality of metal layers in a back-end-of-the-line (BEOL) stack.

FIGS. 6-13 illustrate cross-sectional views of some embodiments of an integrated chip (IC) layout whereon a disclosed method of integrated chip processing that improves back-end-of-the-line (BEOL) reliability is implemented.

Figure 6:
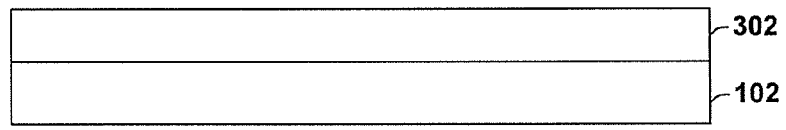
FIGS. 6-13 illustrate cross-sectional views of some embodiments of an integrated chip (IC) whereon a disclosed method of integrated chip processing that improves back-end-of-the-line reliability is implemented.

FIG. 6 illustrates some embodiments of a cross-sectional view 600 corresponding to act 502. As shown in cross-sectional view 600, a first etch stop layer 302 is formed over a semiconductor substrate 102. In various embodiments, the semiconductor substrate 102 may comprise any type of semiconductor body (e.g., silicon, SiGe, SOD such as a semiconductor wafer and/or one or more die on a wafer, as well as any other type of metal layer, device, semiconductor and/or epitaxial layers, etc., associated therewith. In various embodiments, the first etch stop layer 302 may comprise a layer of silicon nitride (SiN), silicon oxide (SiO), or silicon carbon nitride (SiCN).

Figure 7:
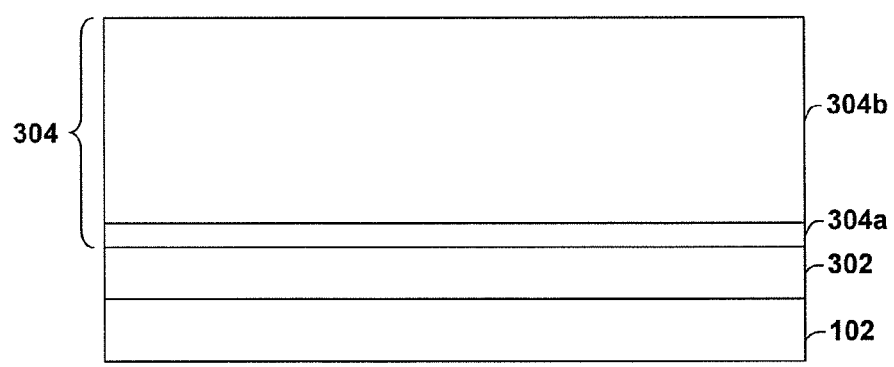

FIG. 7 illustrates some embodiments of a cross-sectional view 700 corresponding to act 504. As shown in cross-sectional view 700, an extreme low-k (ELK) dielectric layer 304 is formed over the first etch stop layer 302. In some embodiments, the ELK dielectric layer 304 is formed by first depositing a lower ELK dielectric layer 304a having a first dielectric constant over the first etch stop layer 302. An upper ELK dielectric layer 304b, having a second dielectric constant less than the first dielectric constant, is subsequently deposited over the lower ELK layer 304a. The lower dielectric constant of the upper ELK dielectric layer 304b dielectric causes the upper ELK layer 304b to have a lower density and a higher porosity than the lower ELK dielectric layer 304a. In some embodiments, the lower and upper ELK dielectric layers, 304a and 304b, are deposited by way of a deposition process (e.g., a physical vapor deposition (PVD) process, a chemical vapor deposition (CVD) process, etc.) performed in a processing chamber held under vacuum.

Figure 8:
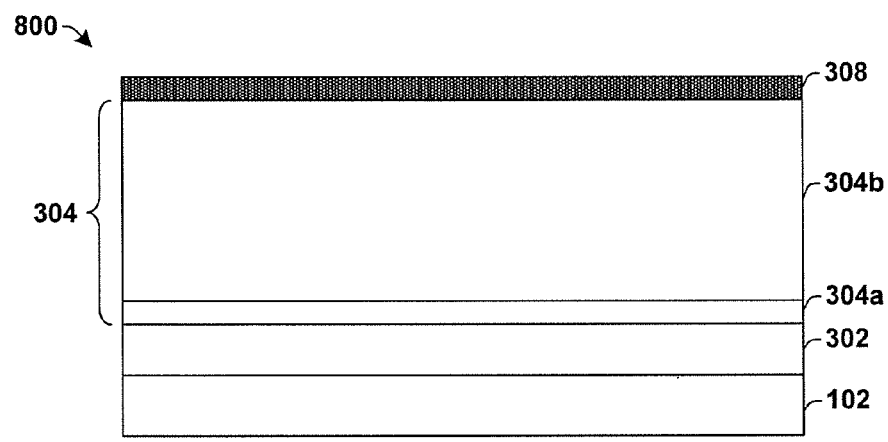

FIG. 8 illustrates some embodiments of a cross-sectional view 800 corresponding to act 506. As shown in cross-sectional view 800, a first capping layer 308 is deposited over the ELK dielectric layer 304. The first capping layer 308 may be deposited by way of deposition process (e.g., a physical vapor deposition process such as sputtering) performed in a processing chamber held under vacuum.

In some embodiments, the first capping layer 308 may comprise a non-ELK film. For example, in some embodiments, the first capping layer 308 may comprise a silicon nitride (SiN) film having a density of greater than 2.4 $g/cm^3$. In other embodiments, the first capping layer 308 may comprise a silicon carbide nitride (SiCN) film having a density in a range of between approximately 1.5 $g/cm^3$ to approximately 2.0 $g/cm^3$. In yet other embodiments, the first capping layer 308 may comprise a silicon dioxide ($SiO_2$) film having a density of approximately 1.5 $g/cm^3$.

In other embodiments, the first capping layer 308 may comprise an ELK film having a density that is greater than a density of the underlying upper ELK dielectric layer 304. For example, in some embodiments, the first capping layer 308 may comprise an ELK film comprising a silicon oxycarbide (SiCO) film having a density in a range of between approximately 1.3 $g/cm^3$ to approximately 1.4 $g/cm^3$. In such embodiments, the density corresponds to a dielectric value in a range of between approximately 2.8 to approximately 3.0. The higher density of the ELK film, in relation to the ELK dielectric layer 304, provides the first capping layer 308 with a lower porosity than that of the ELK dielectric layer 304, thereby improving selectively and mitigating diffusion through the first capping layer 308.

Figure 9:
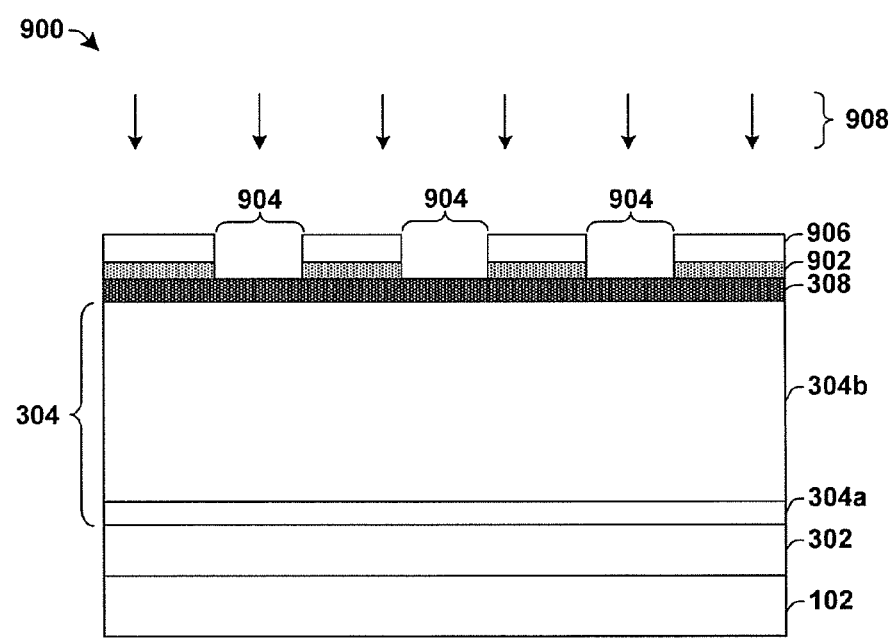

FIG. 9 illustrates some embodiments of a cross-sectional view 900 corresponding to act 508. As shown in cross-sectional view 900, a hardmask 902 is selectively formed over the first capping layer 308. The hardmask 902 comprises a plurality of openings 904 that expose the underlying first capping layer 308 at positions corresponding to metal layer structures. In some embodiments, the hardmask 902 is selectively formed over the first capping layer 308 by forming a photoresist layer 906 over the hardmask 902. The photoresist layer 906 is patterned using a photolithography process, and then the hardmask 902 is exposed to an etchant 908, which removes the hardmask 902 at the plurality of openings 904. In some embodiments, the hardmask 902 may comprise titanium (Ti), aluminum (Al), tantalum (Ta), zirconium (Zr), hafnium (Hf), or some combination thereof, for example.

Figure 10:
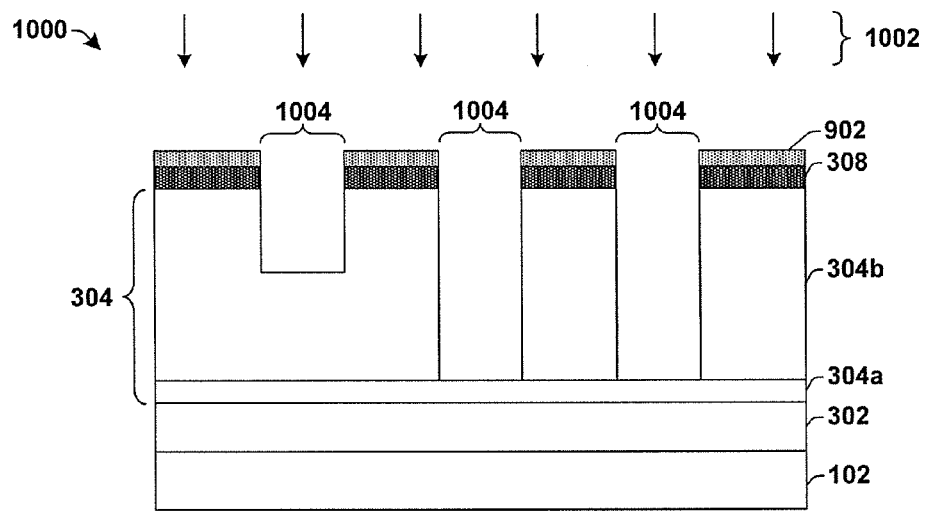

FIG. 10 illustrates some embodiments of a cross-sectional view 1000 corresponding to act 510. As shown in cross-sectional view 1000, an etchant 1002 is applied then to the substrate to selectively etch the first capping layer 308 and the ELK dielectric layer 304 according to the hardmask 902. The etchant 1002 selectively removes the first capping layer 308 and the ELK dielectric layer 304 at the one or more openings in the hardmask 902, resulting in a plurality of cavities 1004 that extend vertically through the first capping layer 308 into the ELK dielectric layer 304. In various embodiments, the etchant 1002 may comprise a wet etchant or a dry etchant.

Figure 11:
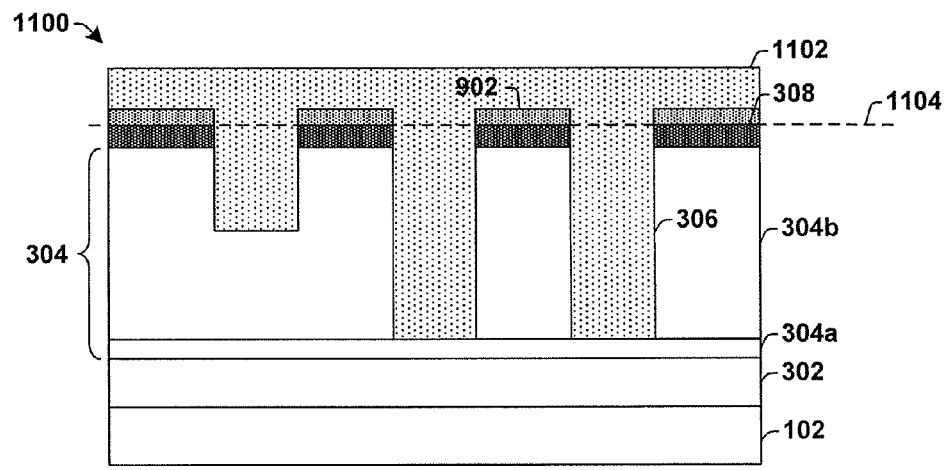

FIG. 11 illustrates some embodiments of a cross-sectional view 1100 corresponding to act 512-514. As shown in cross-sectional views 1100, a metal material 1102 is deposited over the substrate. The metal material 1102 fills the plurality of cavities 1004 to form a plurality of structures in the metal layer 306. In some embodiments, the metal material 1102 may comprise copper deposited by way of deposition process (e.g., a physical vapor deposition such as sputtering). After the metal material 1102 has been deposited, a chemical mechanical polishing (CMP) process is performed to planarize the substrate along line 1104. The chemical mechanical polishing process removes the hardmask 902 and excess metal material 1102 without removing first capping layer 308 from over ELK dielectric layer 304, resulting in a planar interface having structures in the metal layer 306 horizontally interspersed between the first capping layer 308.

Figure 12:
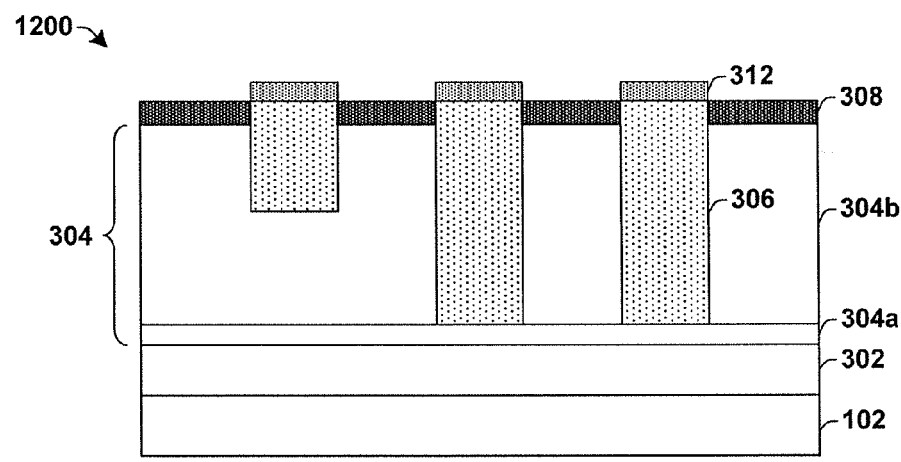

FIG. 12 illustrates some embodiments of a cross-sectional view 1200 corresponding to act 516. As shown in cross-sectional view 1200, a second capping layer 312 is formed over the substrate at a position over the metal layer 306. In some embodiments, the second capping layer comprises a cobalt capping layer that is separated from the ELK dielectric layer 304 by the first capping layer 308. The first capping layer 308 has a high selectivity, such that the thickness of the cobalt capping layer is much greater over the metal layer 306 than over the first capping layer 308. For example, in some embodiments, the thickness of the cobalt capping layer over the metal layer 306 is greater than ten times the thickness of the cobalt capping layer over the first capping layer 308.

Figure 13:
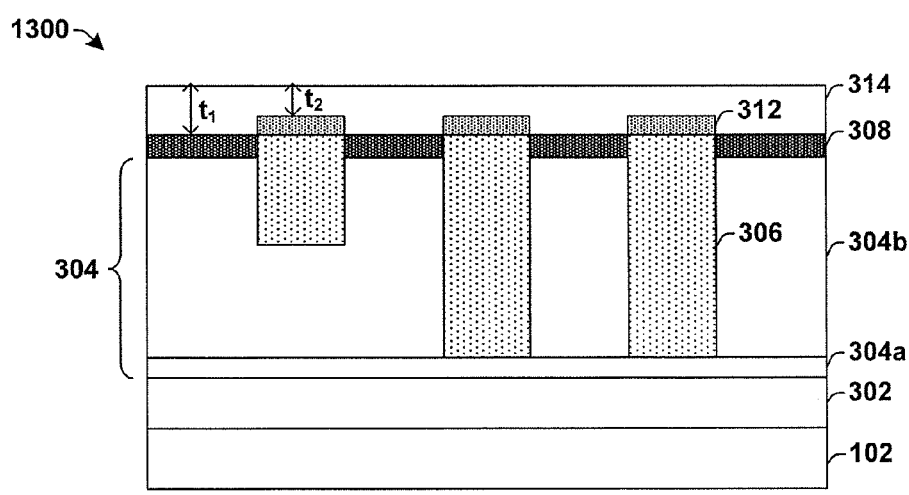

FIG. 13 illustrates some embodiments of a cross-sectional view 1300 corresponding to act 518. As shown in cross-sectional view 1300, a second etch stop layer 314 is formed over the substrate at a position over the first capping layer 308 and the second capping layer 312. The second etch stop layer 314 is formed to have a first thickness $t_1$ over the first capping layer 308 and a second thickness $t_2$ over the second capping layer 312, wherein the first thickness $t_1$ is greater than the second thickness $t_2$ (i.e., $t_1 > t_2$).

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs. Additionally, layers described herein can be formed in any suitable manner, such as with spin on, sputtering, growth and/or deposition techniques, etc.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a method and apparatus for improving back-end-of-the-line (BEOL) reliability.

In some embodiments, the present disclosure relates to a back-end-of-the-line (BEOL) layer of an integrated chip. The BEOL layer comprises a low-k dielectric layer disposed over a semiconductor substrate and one or more metal layer structures disposed within the low-k dielectric layer. A first capping layer is located over the low-k dielectric layer at positions between the one or more metal layer structures, wherein the first capping layer is located along a planar interface having the one or more metal layers interspersed between the first capping layer. A second capping layer is located over the one or more metal layer structures.

In other embodiments, the present disclosure relates to a back-end-of-the-line (BEOL) layer of an integrated chip. The BEOL layer comprises a first etch stop layer disposed over a semiconductor substrate and an extreme low-k (ELK) dielectric layer. The ELK dielectric layer comprises a lower ELK dielectric layer disposed over the first etch stop layer, and an upper ELK dielectric layer disposed over the lower ELK dielectric layer. One or more metal layer structures are disposed within the ELK dielectric layer. A first capping layer is disposed over the ELK dielectric layer at positions between the one or more metal layer structures. The first capping layer has a density greater a density of the upper ELK dielectric layer. A second capping layer is disposed over the one or more metal layer structures.

In other embodiments, the present disclosure relates to an integrated chip (IC) processing method. The method comprises forming an extreme low-k (ELK) dielectric layer comprising one or more metal layer structures over a semiconductor substrate. The method further comprises forming a first capping layer over the ELK dielectric layer at positions between the one or more metal layer structures, wherein the first capping layer has a density that is greater than a density of the ELK dielectric layer. The method further comprises forming a second capping layer over the one or more metal layer structures to a thickness that is greater than a thickness of the second capping layer over the first capping layer.

What is claimed is:

1. A back-end-of-the-line (BEOL) layer of an integrated chip, comprising:
a low-k dielectric layer disposed over a semiconductor substrate;
one or more metal layer structures disposed within the low-k dielectric layer and comprising a copper metal;
a first capping layer located over the low-k dielectric layer at positions between the one or more metal layer structures, wherein the first capping layer is located along a planar interface having the one or more metal layers structures interspersed between the first capping layer; and
a second capping layer located over the one or more metal layer structures, wherein the second capping layer has a greater thickness in areas overlying the copper metal than in areas not overlying the copper metal, causing the second capping layer to have vertical sidewalls that are laterally aligned with vertical sidewalls of the copper metal.

2. The BEOL layer of claim 1, wherein the second capping layer comprises cobalt (Co).

3. The BEOL layer of claim 1,
wherein the second capping layer has a first thickness in a first region, wherein the first region overlies the one or more metal layer structures and diagonally abuts the first capping layer;
wherein the second capping layer has a second thickness in a second region that overlies the first capping layer; and
wherein the first thickness is greater than ten times the second thickness.

4. The BEOL layer of claim 1, wherein the first capping layer comprises silicon nitride (SiN), silicon carbon-nitride (SiCN), or silicon dioxide ($SiO_2$).

5. The BEOL layer of claim 1, wherein the first capping layer comprises an extreme low-k (ELK) film comprising silicon, carbon, and oxygen, wherein the ELK film has a greater density than the low-k dielectric layer.

6. The BEOL layer of claim 5, wherein the ELK film comprises a dielectric constant having a value in a range of between approximately 2.8 and approximately 3.0 and a density in a range of between approximately 1.3 $g/cm^3$ and approximately 1.4$g/cm^3$.

7. The BEOL layer of claim 1,
wherein the low-k dielectric layer comprises:
a lower extreme low-k (ELK) dielectric layer; and
an upper ELK dielectric layer disposed between the lower ELK dielectric layer and the first capping layer, wherein the upper ELK dielectric layer has a density less than densities of the lower ELK dielectric layer and the first capping layer.

8. The BEOL layer of claim 1, wherein the second capping layer has a greater thickness over the one or more metal layer structures than over the first capping layer.

9. The BEOL layer of claim 1, wherein a top surface of the first capping layer and a bottom surface of the second capping layer are disposed along a horizontal plane.

10. A back-end-of-the-line (BEOL) layer of an integrated chip, comprising:
a low-k dielectric layer disposed over a semiconductor substrate;
a first capping layer comprising a first material located over the low-k dielectric layer;
one or more metal layer structures disposed within the low-k dielectric layer and extending through the first capping layer so that the one or more metal layer structures are located between the first capping layer, wherein the one or more metal layer structures comprise a copper metal abutting the first capping layer;
a second capping layer located over the one or more metal layer structures and comprising a second material different than the first material, wherein the second capping layer has a greater thickness in a first region overlying the one or more metal layer structures than in a second region overlying the first capping layer, and wherein the second capping layer in the first region diagonally abuts the first capping layer.

11. The BEOL layer of claim 10, wherein the second capping layer is more than ten times thicker over the one or more metal layer structures than over the first capping layer.

12. The BEOL layer of claim 10, wherein a top surface of the first capping layer and a bottom surface of the second capping layer are disposed along a horizontal plane.

13. The BEOL layer of claim 3, wherein the first capping layer has a height that is less than a height of the one or more metal layer structures.

14. The BEOL layer of claim 10, wherein the first capping layer is configured to abut adjacent ones of the one or more metal layer structures.

15. The BEOL layer of claim 10, wherein the second capping layer has vertical sidewalls that are aligned with vertical sidewalls of the one or more metal layer structures.

16. A back-end-of-the-line (BEOL) layer of an integrated chip, comprising:
a low-k dielectric layer disposed over a semiconductor substrate;
one or more metal layer structures comprising a copper metal disposed within the low-k dielectric layer;
a first capping layer located over the low-k dielectric layer at positions abutting adjacent ones of the one or more metal layer structures, wherein the first capping layer has a height less than the one or more metal layer structures;
a second capping layer located over the one or more metal layer structures, wherein the second capping layer transitions from a first thickness overlying the copper metal to a second thickness less than the first thickness, at a position laterally aligned with a sidewall of the copper metal;
a lower extreme low-k (ELK) dielectric layer arranged over the first capping layer and the second capping layer;
an upper ELK dielectric layer contacting an upper surface of the lower ELK dielectric layer and having a density less than a density of the lower ELK dielectric layer; and
an additional metal structure having linear sidewalls substantially vertically extending from an upper surface of the upper ELK dielectric layer to a lower surface of the lower ELK dielectric layer.

17. The BEOL layer of claim 16, wherein the second capping layer has vertical sidewalls that are aligned with vertical sidewalls of the one or more metal layer structures.

18. The BEOL layer of claim 7, wherein additional metal structure has a lower surface contacting the second capping layer.

* * * * *